United States Patent [19]

Blackwood

[11] Patent Number: 4,533,191

[45] Date of Patent: Aug. 6, 1985

[54] IDC TERMINATION HAVING MEANS TO ADAPT TO VARIOUS CONDUCTOR SIZES

[75] Inventor: Harry P. Blackwood, Wilton, Conn.

[73] Assignee: Burndy Corporation, Norwalk, Conn.

[21] Appl. No.: 553,906

[22] Filed: Nov. 21, 1983

[51] Int. Cl.[3] ..................... H01R 29/00; H01R 11/20; H01R 43/04; H05K 3/30

[52] U.S. Cl. ............................... 339/31 R; 339/97 R; 339/99 R; 29/838; 29/866

[58] Field of Search ..................... 339/97 R, 97 P, 98, 339/99 R, 31 R, 96, 97 C, 177 R, 177 E, 143 R, 223 R; 29/831, 832, 837–840, 857, 861, 865–867

[56] References Cited

U.S. PATENT DOCUMENTS

| | | | |
|---|---|---|---|
| 2,970,184 | 1/1961 | Blonder | 339/49 X |
| 3,743,748 | 7/1973 | Reeder | 339/177 E X |
| 3,805,214 | 4/1974 | Demler, Sr. et al. | 339/275 B X |
| 3,828,298 | 8/1974 | Schumacher | 339/223 R X |
| 3,915,535 | 10/1975 | O'Keefe et al. | 339/177 R X |
| 4,261,632 | 4/1981 | Narozny | 339/97 C |
| 4,283,105 | 8/1981 | Ferrill et al. | 339/97 R |
| 4,288,141 | 9/1981 | Leather | 339/97 R |

*Primary Examiner*—Gil Weidenfeld
*Assistant Examiner*—Steven C. Bishop
*Attorney, Agent, or Firm*—Howard S. Reiter

[57] ABSTRACT

An insulation displacement connector contact and process for electrically contacting a conductor by displacement of an insulating layer. The contact comprises a member including a slot having a desired width. The slot is defined by opposing legs of the member and a non-linear deformable web connecting the legs. By deforming the web it is possible to change the desired width of the slot to thereby adapt the contact to various conductor sizes. An electrical connector preferably adapted for terminating a coaxial cable on a printed circuit board employs such contacts.

15 Claims, 8 Drawing Figures

IDC TERMINATION HAVING MEANS TO ADAPT TO VARIOUS CONDUCTOR SIZES

BACKGROUND OF THE INVENTION

This invention relates to an improved, installation displacement contact and to an electrical connector employing such a contact. The invention has particular application to electrical connectors for terminating a coaxial cable. The contact of this invention is particularly suited for use in a connector for application to a printed circuit board.

Reference is hereby made to two copending applications assigned to the same assignee as this application; "IDC Termination For Coaxial Cables" by Leonard Feldberg, Ser. No. 557,771, filed on Nov. 14, 1983, and "IDC Termination For Coaxial Cable Having Alignment and Stabilizing Means" by H. Blackwood Ser. No. 553,833, filed on Nov. 21, 1983. These cross-referenced applications are incorporated herein by reference in their entirety.

Electrical connectors employing insulation displacement contacts are well known in the art and are commercially available from companies, such as Burndy Corporation, Norwalk, Ct. By using insulation displacement contacts, it is unnecessary to strip the insulation from the wire to be contacted. The contact has a blade-like configuration with a slot having a width corresponding to the diameter of the electrical conductor. When the insulated wire is pressed into the slot, the edges of the slot displace the insulation to allow intimate electrical contact between the conductor and the slot edges. The use of such insulation displacement contacts in a wide variety of electrical connectors is illustrated by reference to U.S. Pat. Nos. 3,112,147, 3,118,715, 3,434,093, 3,617,983, 3,772,635, 3,835,444, 3,836,944, 3,842,392 and 3,848,951. In some of the connectors illustrated in these patents, the insulation displacement contact includes two contact slots in axial alignment which are electrically connected to provide a redundant contact to the conductor.

In prior art insulation displacement contacts, the slot into which the conductor is pushed to make electrical contact has a width dictated by the tooling used to manufacture it. The width of the slot cannot be readily changed due to the nature of the tooling which is very expensive. The tooling employed usually requires a series of steps that begins with a blank metal strip in order to form the insulation displacement contact. This problem is overcome, in accordance with this invention, by modifying the insulation displacement contact so that the width of the slot can be readily varied such as by one additional step of the manufacturing process. The tooling can, therefore, provide one basic insulation displacement contact and, then, in one last step, shape the contact to provide the exact width of the slot desired.

The adjustable slot width insulatio;n displacement contact of this invention is particularly applicable for terminating a coaxial cable. Coaxial cables generally come in a wide range of diameters. The coaxial cable can comprise a single strand cable or a ribbon-type cable. In a coaxial cable, the central conductor is shielded from outside interference by a surrounding conductor which is spaced therefrom. An insulating layer separates the surrounding shield and the central conductor. An insulating jacket, in turn, surrounds the shield. The shield may be braided, metallic wire or foil, etc. When the shield comprises a foil, it is known to utilize a drain wire in contact therewith for terminating the foiled shielding.

Ribbon-type coaxial cables including a plurality of individual cable elements with a common outer insulating jacket are also known. As for example, the ribbon coaxial cables described in U.S. Pat. Nos. 3,963,319 to Schumacher and 4,035,050 to Volinskie. These patents also disclose electrical connectors for terminating the ribbon-type cable to a printed circuit board. The cables described in these patents employ a center conductor and drain wire lying parallel to one another. The electrical contacts of the connector are connected to the respective conductors and the wires are laterally displaced from one another. The result is an electrical connector assembly of substantial width since the contacts of the connector are spaced laterally for connection to parallel drain and central conductors.

An ordinary coaxial cable generally employs a braided shield. With respect to such cables, considerable difficulty and time is consumed in assemblying them to circuit boards. Further, the manner in which the cables must be stripped to reveal the shield and conductors can result in a mismatch of impedance. In accordance with the prior art approach, the insulation around the braid is cut quite far back. The braid is then combed out and cut back somewhat less than the outer insulating jacket to expose the insulation around the conductor. The insulation around the conductor is then cut back about midway between the end of the braid and the end of the conductor to expose the conductor. The conductor is terminated to the circuit board and the braid is "pig-tailed" and then joined to the circuit board.

Several problems exist in this prior art approach. The braid and the center conductor can be nipped during stripping thereby deteriorating the performance of the cable. Also, since the braid is cut back more than the central conductor, there is an impedance mis-match and this can produce a distorted signal. Obviously, the prior art process, being a multiple step manual one, is extremely time consuming and slow.

SUMMARY OF THE INVENTION

In accordance with this invention, an insulation displacement connector contact is provided for electrically contacting a conductor by displacement of an insulating layer. A contact comprises a member including a slot having a desired width. The slot is defined by opposing legs of the member and a non-linear deformable web connecting the legs. By deforming the web, it is possible to change the desired width of the slot and thereby adopt the contact to various conductor sizes.

By varying the deformation or bending of the web connecting the legs of the contact, an accordion-like effect is provided which allows the width of the slot to be varied. The tooling producing the IDC contact in accordance with this invention can be set up to provide one basic contact shape and then, in a final step during production or at assembly, the web can be bent like an accordion to provide the exact slot width size desired.

In accordance with this invention, an electrical connector is provided which is particularly useful for connecting to a coaxial cable. The connector of this invention employs a plurality of the afore-noted IDC contacts having a variable width slot. A coaxial cable comprises at least one central conductor defining a cable axis; at least one surrounding conductor shield element; an insulating layer arranged between the shield and the conductor; and an outer insulating jacket arranged about the shield. The connector comprises a first IDC variable slot width contact means for electrically contacting the shield by displacement of the insulating jacket. The first contact means preferably includes means for stabilizing the electrical connection between the first contact means and the shield. A second IDC variable slot width contact means is provided for electrically contacting the central conductor by displacement of the insulating layer.

A contact support means comprising a base member for supporting the first and second contact means is provided with the contact means arranged on the base member along a contact axis with a second contact means following the first contact means and being electrically insulated therefrom.

The electrical connector thus described requires that the braid and the outer jacket be cut back more than the central conductor. However, the amount of the cut back is relatively small, such as on the order of approximately ⅛th of an inch, which is much less than in the prior art approaches. As a result, the extent of impedance mis-match is minimized. Further, only one cut in the outer installation and braid is required before installation of a connector, and it is not necessary to comb or pigtail the braid before attaching the connector. Conventional coaxial cable stripping tools can easily perform the one cut-back operation.

The stabilizing means preferably comprises a first prong arranged to be inserted in electrical contact with a first side of the shield and a second prong arranged to be inserted in electrical contact with a second and opposing side of the shield. The prongs are supported by the respective legs of the first contact means.

Preferably, the first contact means comprises an IDC variable slot width contact with a first slot having a first width, and with the prongs being arranged with the adjacent opposing sides of the first slot. The second contact means comprises an IDC variable contact having a second slot with a second width narrower than the first width. The contacts themselves can include pin portions for insertion and connection to a printed circuit board. A cover member preferably snap locks onto the base to lock the coaxial cable in place. Preferably, the cover member is integrally hinged to the base and includes anvil portions for pushing the cable into the contact slots as the cover member is closed.

The shield preferably comprises a braided shield on the prongs and the first IDC variable slot width contact can comprise a unitary member. The coaxial cable connector of this invention can be used for terminating a single coaxial cable or any desired number of coaxial cables.

In accordance with the process of this invention, an installation displacement contact is formed so as to comprise a member including a slot being defined by opposing legs of the member with a non-linear deformable web connecting the legs. The width of the slot is varied or changed by deforming or bonding the web in order to provide a desired slot width different from the original slot width. Whereby, the slot width of the IDC contact can be varied to adapt the contact to various contact sizes.

In accordance with another embodiment of this invention, a coaxial cable connector is provided as described. A small portion at the end of the coaxial cable is stripped down from the insulating layer leaving an end portion of the cable including the insulating layer and central conductor and the remaining portion of the cable further including the shield and the outer jacket. The stripped cable is then inserted in the connector by forcing the end portion of the cable into the second contact slot and an unstripped portion of the cable into the first contact slot. Each of the respective contacts displaces the insulation to make intimate electrical connection to the respective shield or central conductor.

The electrical connection between the first contact and the shield is preferably stabilized by insertion of the prongs into the shield. When the cable is connected to the contacts, the contact axis corresponds to a cable axis defined by the central conductor.

Accordingly, it is an object of this invention to provide an improved IDC electrical contact wherein the contact slot width can be varied to adapt the contact to various conductor sizes. It is a further object of this invention to provide an improved electrical connector employing such variable slots with both IDC contacts.

It is a still further object of this invention to provide an improved electrical connector, as above, which is adapted for use with a coaxial cable and which can be used as a coaxial cable termination on a circuit board.

It is a still further object of this invention to provide a process for varying the slot width as an IDC electrical contact.

It is yet a further object of this invention to provide a process as above further including connecting an electrical connector as above to a coaxial cable.

These and other objects will become more apparent from the following descriptions and drawings in which like elements have been given common reference numerals.

DETAILED DESCRIPTION OF THE PREFERRED EMBODIMENTS

Figure 1:
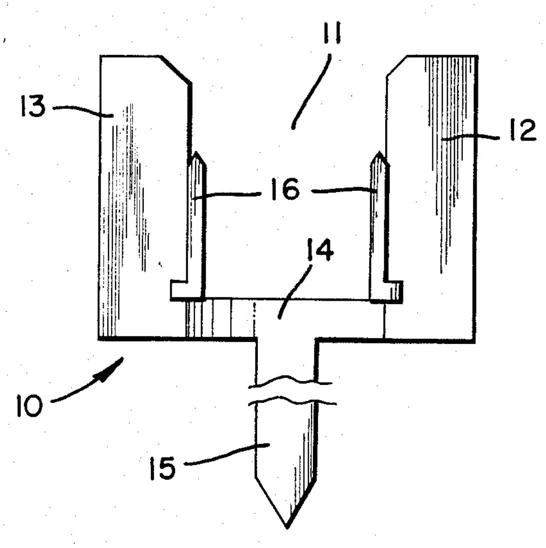
FIG. 1 is a front view of a variable slot width IDC contact in accordance with this invention.
Figure 2:
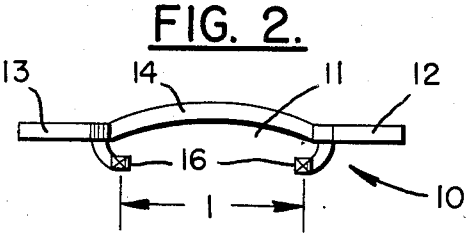
FIG. 2 is a top view of the contact of FIG. 1.
Figure 3:
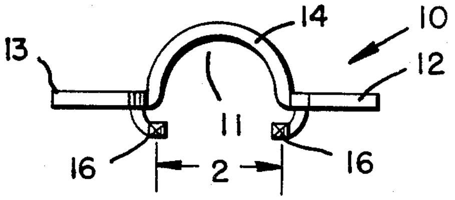
FIG. 3 is a top view of the contact of FIGS. 1 and 2 after the deformable web has been bent to change the slot width.

Referring now to FIGS. 1–3, a variable slot width IDC electrical contact 10 is shown in accordance with a preferred embodiment of the invention. The contact 10 comprises a member including a slot 11 having a desired width. The slot is defined by opposing legs 12 and 13 and a non-linear deformable web 14 connecting the legs 12 and 13.

The web 14 may have any desired non-linear shape such as the arcuate shape as shown in FIG. 2. Alternatively, if desired it could have a V-shape or a series of accordion-like pleats. The web 14 is intended to be deformable so that it can be readily bent to change to the width of the slot 11. For example, if the web is flattened out as in FIG. 2, the width of the slot can be increased equal distance "1". Alternatively, it it is collapsed by being bent in an accordion-like fashion as in FIG. 3, the width of the slot 11 is decreased equal to distance "2".

Accordingly, by deforming the web 14 in the manner described, it is possible to change the desired width of the slot 11 to adapt the contact 10 to various conductor or shield sizes.

The contact 10, in accordance with this invention, is usually formed from a metal strip by adding one additional step to the process which would deform the web 14 a desired amount. A vent is placed in the web of the contact 10 to determine the width of the slot 11. Thus, one set of manufacturing tooling can provide a contact 10 comprising a basic shape as in FIG. 2. Then, one additional step of bending or flattening the web 14 can provide the exact width of the slot 11 which is desired.

The contact 10 of FIGS. 1 through 3 preferably also includes a pin portion 15 which is adapted for insertion in a circuit board (not shown). The pin portion 15 alternatively can take the form of two pins which are pressed into the circuit board and are attached to the legs 12 and 13, respectively, rather than to the web 14.

The contact, when employed with a coaxial cable, further preferably includes prongs 16 supported by each of the legs 12 and 13. The function of prongs 16 will be described in greater detail later, however, they serve to stabilize the electrical contact between the shield of the coaxial cable and the contact 10.

Referring now to FIGS. 4–8, an electrical connector 17 is shown in accordance with a preferred embodiment of this invention. The connector 17 comprises a base member 18, a hinged cover member 19 and a plurality of electrical contacts 10. The electrical contacts 10 comprise variable slot width insulation displacement contacts of this invention. Each contact 10 includes a slot 11 or 11′ and pin portions 15. The pin portions 15 are adapted for insertion in respective contact holes of a printed circuit board. Each contact 10 comprises an integral metal member and is arranged in the base member 8 so that it is electrically isolated or insulated from each of the other contacts 10. The slot 11 is relatively wider than the slot 11′.

The connector 17 of this invention is particularly adapted for use with coaxial cable having a braided shield 20. The braided shield 20 comprises a loose and relatively "mushy" weave of hair-size, metallic strands which are easily moved about on the coaxial cable when pushed by external elements such as contacts 10. Accordingly, the slot 11 of the contact 10 may not make sound electrical contact due to separation of the weave of the braided shield 20.

In order to provide a means for stabilizing the electrical connection between the contacts 10 having the slot 11 and the braided shield 20 in accordance with this invention, preferably first and second prongs 16 are arranged to be inserted in the braid of the shield 20 in electrical contact therewith at a first and an opposing side of the shield 20. The prongs 16 are supported by the contact means 10 having the wider slot 11 and preferably comprise a unitary member therewith.

The prongs 16 are pushed or inserted through the metal braid or shield 20 such that the braided material tends to close about the cross section of the prongs 16 providing a good stable electrical connection. The slot 11, portion of the contact 10, can also make electrical contact with the shield 20. However, even if that electrical contact is not stable, good electrical contact is preferably provided by the prongs 16. The prongs 16 provide a side-to-side stability so that it is virtually certain that the shield 20 will always make a good ground connection. The purpose of the prongs 16 is to make a consistent connection with the shield 20. If the prongs are inserted into the braid 20, but the slot 11 of the contact 10 does not make electrical contact therewith, the slot 11 will, in any event, hold the prongs 16 in position in electrical engagement with the braid 20.

The electrical contacts 10 with the wider slots 11 and prongs 16 are adapted to contact the shields 20 of the coaxial cable 21. The electrical contacts 10 with the narrow slots 11′ are adapted to contact the central conductor 22 of the coaxial cable 21.

Figure 7:
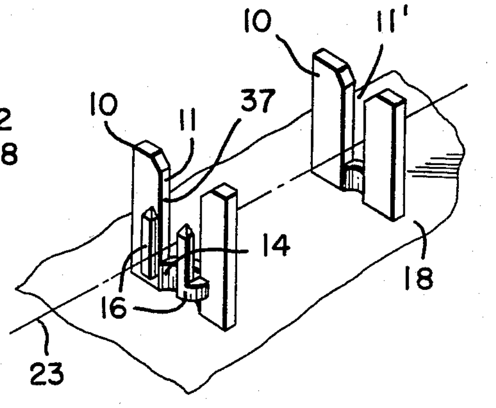
FIG. 7 is a partial perspective view showing a set of electrical contacts arranged in the base support.
Figure 8:
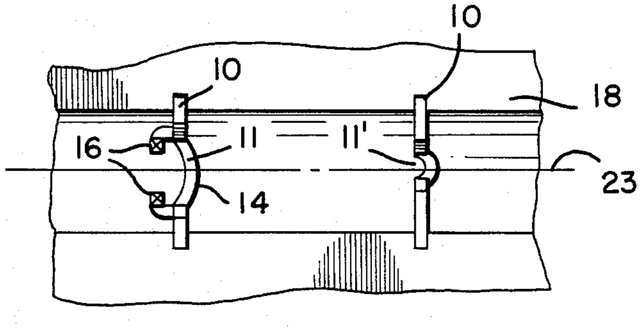
FIG. 8 is a top view of the electrical contact arrangement of FIG. 7.

Each coaxial cable 21 requires a set of contacts 10 comprising a first contact having a slot 11 and prongs 16 and a second contact having a slot 11′. The first and second contacts 10 are arranged along a contact axis 23, as shown in FIGS. 7 and 8, with the second contact having the slot 11′ and no prongs 16 being arranged following the first contact 10 having the slot 11 and prongs 16. When the cable 21 is connected to the contacts 10, the contact axis 23 corresponds to the cable axis defined by the central conductor 22. The contact axis 23 runs centrally of the slots 11 and 11′.

Figure 4:
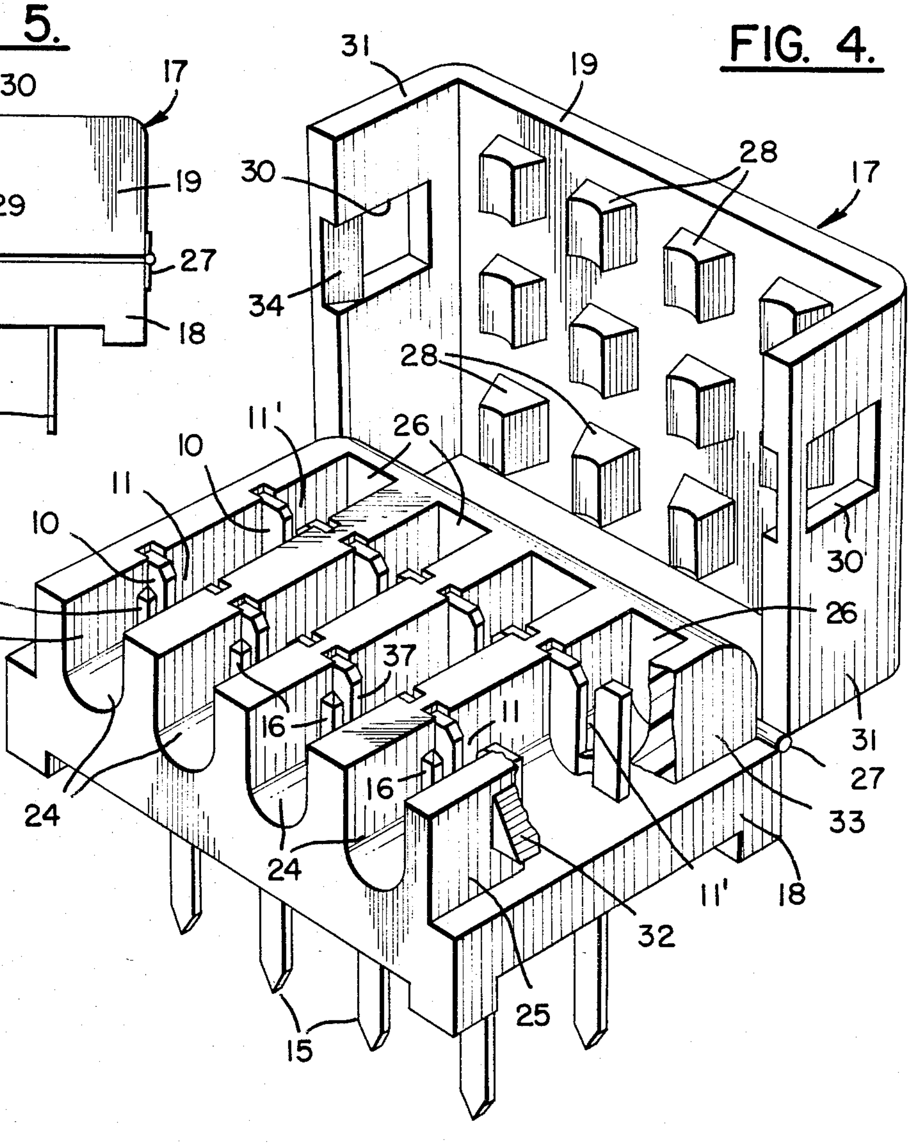
FIG. 4 is a perspective view of an electrical connector for a coaxial cable in accordance with one embodiment of the invention.
Figure 6:
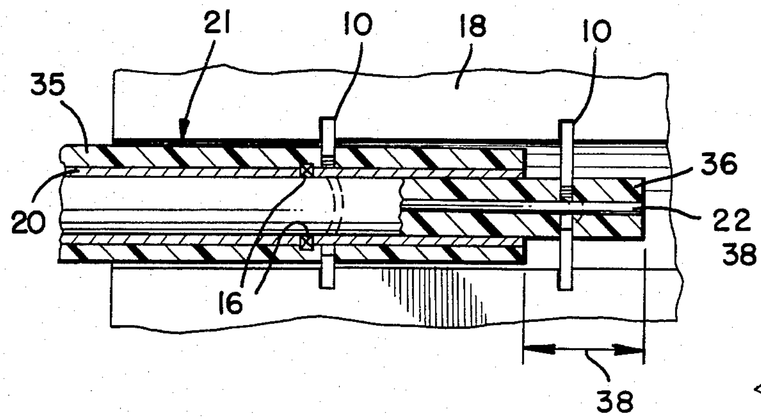
FIG. 6 is a partial top view showing a coaxial cable cross section inserted in a set of IDC electrical contacts of the electrical connector as in FIG. 4.

In the embodiment shown in FIG. 4, the portions of the contacts 10, including the slots 11 and 11′, are arranged within slots 24 of base member 18. Each of the slots 24 is adapted to receive a coaxial cable 21. The slots 24 are defined by side walls 25 and end walls 26. A portion of the first side wall 25 has been cut away to reveal the contacts 10.

In the connector shown in FIG. 4, there are four slots 24, each including a set of contacts 10. This electrical connector is adapted to terminate four coaxial cables 21. Electrical connectors can be fabricated in accordance with this invention to terminate one coaxial cable 21 or, in the alternative, any desired number of coaxial cables merely by providing the desired numbers of sets of contacts 10.

The cover member 19 is hinged to the base member 18 by an integral hinge portion 27. In practice, the cover member 19, base member 18 and integral hinge 27 are formed by molding as a single piece. Cover member 19 can include a plurality of anvil portions 28 arranged within the slots 24. The anvil portions 28 serve to push the coaxial cable 21 into the slots 24 so as to make electrical connection to the contacts 10. They also serve to clamp the cable 21 in place to prevent it from pulling out of the connector 17.

Figure 5:
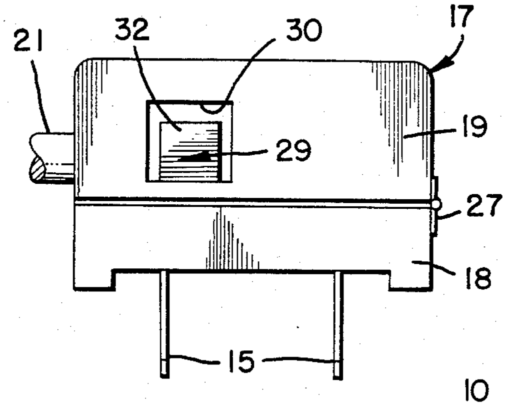
FIG. 5 is a side view of the electrical connector of FIG. 4.

When the cover 19 is closed as in FIG. 5, it is locked in place by means of a latch mechanism 29. The latch mechanism 29 comprises windows 30 in the side walls 31 of the cover member 19. Corresponding latching projections 32 extend outwardly from the side walls 33 of the base member 18. An inclined lip portion 34 is arranged at the bottom inside of each of the windows 30. When the cover member 19 is pivoted to the closed position, as shown in FIG. 5, the latching projections 32 engage the inclined lip portions 34 to spread apart the side walls 31 of the cover member 19 until the cover is fully closed. At this time, the projections 32 seat within the windows 30 so that the side walls 31 spring back to their original shapes thereby locking the cover member 19 to the base member 18.

The electrical contacts 10 are preferably formed of a high strength, high conductivity metal such as a copper base alloy. The contacts 10 are relatively thin so that they have a blade-like effect. When the coaxial cable 21 is inserted into the electrical connector 17 of this invention, the outer insulating jacket 35 and the insulating layer 36 are pierced or displaced by the edges 37 defining the slots 11 or 11' in the contacts 10. These edges 37 then are in intimate electrical contact with the shield 20 or central conductor 22. Intimate electrical contact with the shield 20 is insured in accordance with this invention by the presence of the prongs 16 on the contact 10, having the wider slot 11, which serve to stabilize the electrical connection.

The process of the present invention preferably comprises providing an electrical connector 17 which includes one or more sets of contacts 10. The slot widths of the contact 10 are first set by deforming or bending the respective webs 14 desired amounts. A portion 38 of the coaxial cable 21 is stripped of the outer jacket 35 and shield 20 so that the insulating layer 36 is bared. The length of the portion 30 may be relatively short, such as, for example, approximately $\frac{1}{8}$th of an inch. The cable 21 is then inserted in the slot 24 of the connector 17 so that the portion 38 is pressed into the slots 11' of the contact 10 while an unstripped portion of the cable 21 is pressed into the slot 11 of a contact 10 so that the prongs 16 are inserted into the shield 20 to provide a stable electrical connection irrespective of the connection between the slot 11 and the shield 20. The cable 21 may be placed or pressed into the slot 24 such as by a machine or by hand, or by the action of the anvils 28 of the cover member 19 as it is pivoted into its locked position.

FIGS. 1–3 depict a contact having prongs 16 and web 14. The web 14 may also be used in a contact without the prongs such as the contact used to hold the central conductor 22 depicted in FIGS. 6–8.

If the coaxial cable 21 comprises a ribbon-type cable including a plurality of coaxial cable elements, electrical connector 17 can be used with minor modification. Such modification would comprise eliminating the intermediate side walls 25 lying between the outside side walls. While connector 17 shows only one contact 10 being used to connect to the portion 38, or the unstripped portion, of the cable, it is within the scope of this invention to employ redundant contacts electrically interconnected in place of the single contact shown for each of the contact sets.

The patents and applications described in the background of the invention herein are intended to be incorporated in their entirety by reference herein.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

I claim:

1. An insulation displacement connector contact for electrically contacting a conductor by displacement of an insulating layer, said contact comprising a member including a slot having a desired width, said slot being defined by opposing legs of said member and a non-linear deformable web connecting said legs, wherein by deforming said web, it is possible to change said desired width of said slot to thereby adapt said contact to various conductor sizes and prongs supported by each of said legs at opposing sides of said slot for stabilizing the electrical connection between the contact and a shield of a coaxial cable by being adapted to be positioned within said shield.

2. A contact as in claim 1 wherein said deformable web has a curved shape.

3. A contact as in claim 1 wherein said contact further includes a pin portion integral therewith adapted to be inserted in a circuit board.

4. A connector for a coaxial cable, said cable comprising at least one central conductor defining a cable axis; at least one surrounding conductive shield element; a first insulating layer arranged between said shield element and said conductor; and an outer insulating jacket arranged about said shield element; said connector comprising two independent electrical contacts for simultaneously establishing electrical connections to said central conductor and said conductive shield including:

a first insulating displacement contact, said first contact comprising a member including a slot having a desired width said slot being defined by opposing legs of said member and a non-linear deformable web connecting said legs, wherein by deforming said web, it is possible to change said desired width of said slot to thereby adapt said first contact to various conductor sizes, for electrically contacting said shield element by displacement of said outer insulating jacket and prongs supported by each of said legs at opposing sides of said slot for stabilizing the electrical connection between said first contact and said shield element by being adapted to be positioned within said shield element;

a second insulation displacement contact, said second contact comprising a member including a slot having a desired width said slot being defined by opposing legs of said member and a non-linear deformable web connecting said leg, wherein by deforming said web, it is possible to change said desired width of said slot to thereby adapt said second contact to various conductor sizes, for electrically contacting said central conductor by displacement of said insulating layer; and contact support means comprising a base member for supporting said first and second contacts, said contacts being arranged on said base member along a contact axis with said second contact following said first contact and being electrically isolated therefrom, whereby when said cable is connected to said contacts, said contact axis corresponds to said cable axis.

5. A connector as in claim 4 wherein said first contact comprises said member including a first said slot wherein said web has been deformed a desired amount to provide a first width; and wherein said second contact comprises said member having a second said slot wherein said web has been deformed to provide a second width narrower than said first width and wherein said slots are arranged along said contact axis, whereby said cable is adapted to be pressed into said slots.

6. A connector as in claim 5 wherein said contacts comprise metal blade members further including pin portions for connection to a circuit board.

7. A connector as in claim 6 further including a cover member and means for locking said cover member to said base member.

8. A connector as in claim 7 wherein said cover member is hinged to said base member to pivot between an open position for inserting said coaxial cable and a closed position for locking said coaxial cable in place and wherein said cover member includes anvil portions for engaging said cable when said cover member is closed.

9. A connector as in claim 8 wherein said first contact and said second contact comprise a contact set for a coaxial cable and wherein said connector includes a plurality of said contact sets.

10. A process for terminating a coaxial cable, said cable comprising at least one central conductor defining a cable axis; at least one surrounding conductive shield element; a first insulating layer arranged between said shield and said conductor; and an outer insulating jacket arranged about said shield element; said process comprising:

providing an electrical connector including a first contact for electrically contacting said shield element by displacement of said insulating jacket and a second contact for electrically contacting said central conductor by displacement of said insulation layer and a contact support means comprising a base member for supporting said first and second contacts, said contacts being arranged on said base member along a contact axis with said second contact following said first contact and being electrically isolated therefrom;

stripping away a short portion of said outer insulating jacket and said shield element from an end portion of said coaxial cable;

inserting said end portion of said coaxial cable into said second contact so that said insulating layer is displaced and said contact is in intimate electrical contact with each of said central conductors;

inserting an unstripped portion of said cable into said first contact so that said insulating jacket is displaced by said first contact to make intimate electrical contact with said shield; and stabilizing the electrical connection between said first contact and said shield element by providing first and second prongs electrically connected to and supported by said legs of said first contact and inserting said prongs into said shield element as said cable is inserted into said first contact.

11. A process as in claim 10 wherein said shield element comprises a braided shield element.

12. A process as in claim 11 further including the step of locking said coaxial cable into contact with said first and second contacts.

13. A process as in claim 12 further including the step of connecting said electrical connector to a printed circuit board.

14. A connector for a coaxial cable, said cable comprising at least one central conductor defining a cable axis at least one surrounding conductive shield element; a first insulating layer arranged between said shield element and said conductor; and an outer insulating jacket arranged about said shield element; said connector comprising:

a first insulating displacement contact, said contact comprising a member including a slot having a desired width said slot being defined by opposing legs of said member and a non-linear deformable web connecting said legs, wherein by deforming said web, it is possible to change said desired width of said slot to thereby adapt said contact to various conductor sizes, for electrically contacting said shield element by displacement of said outer insulation jacket;

a second insulation displacement contact, said contact comprising a member including a slot having a desired width said slot being defined by opposing legs of said member and a non-linear deformable web connecting said legs, wherein by deforming said web, it is possible to change said desired width of said slot to thereby adapt said contact to various conductor sizes, for electrically contacting said central conductor by displacement of said insulating layer;

said first contact comprises said member including a first slot wherein said web has been deformed a desired amount to provide a first width; and wherein said second contact comprises said member having a second slot wherein said web has been deformed to provide a second width narrower than said first width and wherein said slots are arranged along said contact axis, whereby said cable is adapted to be pressed into said slots;

said contacts comprising metal blade members further including pin portions for connection to a circuit board; and contact support means comprising a base member for supporting said first and second contacts, said contacts being arranged on said base member along a contact axis with said second contact following said first contact and being electrically isolated therefrom, whereby when said cable is connected to said contacts, said contact axis corresponds to said cable axis, and including a cover member and means for locking said cover member to said base member, said cover member being hinged to said base member to pivot between an open position for inserting said coaxial cable and a closed position for locking said coaxial cable in place and wherein said cover member includes anvil portions for engaging said cable when said cover member is closed.

15. A connector as in claim 14 wherein said first contact and said second contact comprise a contact set for a coaxial cable and wherein said connector includes a plurality of said contact sets.

* * * * *